United States Patent [19]

Nath

[11] 4,419,530

[45] Dec. 6, 1983

[54] SOLAR CELL AND METHOD FOR PRODUCING SAME

[75] Inventor: Prem Nath, Troy, Mich.

[73] Assignee: Energy Conversion Devices, Inc., Troy, Mich.

[21] Appl. No.: 347,779

[22] Filed: Feb. 11, 1982

[51] Int. Cl.³ .................... H01L 31/06; H01L 25/02; H01L 31/18
[52] U.S. Cl. .................................. 136/251; 136/244; 136/249; 136/258; 136/290; 29/572; 29/574; 29/583
[58] Field of Search ............... 136/244, 251, 249 MS, 136/249 TJ, 290, 258 AM; 29/572, 574, 580, 583, 588, 589

[56] References Cited

U.S. PATENT DOCUMENTS

| | | | |
|---|---|---|---|
| 3,151,379 | 10/1964 | Escoffery | 29/572 |
| 3,880,633 | 4/1975 | Jordan et al. | 65/60 |
| 4,245,386 | 1/1981 | Kausche | 29/572 |
| 4,249,959 | 2/1981 | Jebens | 136/244 |
| 4,272,641 | 6/1981 | Hanak | 136/249 |
| 4,315,096 | 2/1982 | Tyan et al. | 136/244 |
| 4,353,161 | 10/1982 | Turner | 29/572 |

*Primary Examiner*—Aaron Weisstuch
*Attorney, Agent, or Firm*—Marvin S. Siskind

[57] ABSTRACT

A method of electrically isolating portions of a large surface area semiconductor body for various purposes such as the production of improved photovoltaic and semiconductor devices is disclosed herein. In the preferred embodiment, the photovoltaic devices are of the type which include a common, electrically conductive substrate layer, a semiconductor body deposited upon the substrate layer, and a transparent electrically conductive coating layer is deposited atop the amorphous body. The method includes the steps of dividing the semiconductor body into a plurality of electrically-isolated portions which may include a grid pattern, testing the electrical output of each of the isolated portions of the semiconductor body, connecting only those isolated portions providing satisfactory electrical output to an electrically conductive strip which provides an electrical contact from the semiconductor body, and providing an electrical contact on the substrate, whereby the overall efficiency of the photovoltaic or semiconductor device is improved. The improved solar cell includes a plurality of electrically isolated portions into which the semiconductor body thereof is divided, at least one electrically conductive strip, each isolated portion of the semiconductor body which provides satisfactory electrical output is electrically connected to the conductive strip to provide an electrical contact associated with the semiconductor body, an electrical contact associated with the substrate layer, and an upper, electrically-insulating, protective layer and a lower electrically-insulating layer encapsulate the solar cell. A plurality of such solar cells are electrically connected to form a solar cell panel. Other methods of utilizing electrically isolated portions of a semiconductor body include the production of small surface area semiconductor devices from larger surface area semiconductor devices and a process for improving the electrical output of those isolated portions of a semiconductor body which provide unsatisfactory electrical output.

24 Claims, 5 Drawing Figures

SOLAR CELL AND METHOD FOR PRODUCING SAME

FIELD OF THE INVENTION

This invention relates generally to photovoltaic devices particularly adapted for use as solar cells and more particularly to a method of electrically isolating portions of the semiconductor body of a photovoltaic device for such uses as producing improved solar cells and semiconductors.

BACKGROUND OF THE INVENTION

This invention deals with a method of electrically isolating portions of a large surface area photovoltaic device for a plurality of purposes such as the production of smaller surface area semiconductor devices. Generally, the invention contemplates the use of electrically conductive grid patterns applied on the transparent conductive layer to divide the semiconductor body of the photovoltaic device into a plurality of isolated portions. Each individual isolated portion is tested for electrical output and those isolated portions providing unsatisfactory electrical output are electrically isolated from the isolated portions providing satisfactory electrical output. Thus, areas of a photovoltaic device not measuring up to preselected standards of electrical output are identified and isolated so as not to interfere with the operation of the remaining portions of the device. The isolation method may also be used to cut small surface area semiconductor devices from larger surface area semiconductor devices, and to improve the electrical output of unsatisfactory isolated portions of the semiconductor body.

Patterns are commonly etched onto the surface of photovoltaic cells and semiconductors through the use of photoresist films. Typically, a photoresist solution is applied to the surface of the semiconductor body and the solvent is removed, thus leaving a thin film as a residue. A grid or circuit pattern of some sort, masking part of the film, is placed over the film, and those portions of the film not covered by the pattern are exposed to ultraviolet electromagnetic radiation or to a beam of electrons of appropriate energy. During development of the film, employing conventional procedures, either the exposed or the unexposed portions of the film are removed, and the pattern is etched through the transparent conductive oxide layer of the semiconductor. The remainder of the photoresist is removed and the grid pattern is applied onto the surface of the isolated portions of the transparent layer. In the course of the processing, drying and curing steps are conventionally performed in air, pursuant to a selected time-temperature regimen.

Recently, considerable effort has been expended to develop processes for depositing amorphous semiconductor alloy layers which may be of relatively large surface area and which may be readily doped to form p-type and n-type materials. These amorphous semiconductors are used for p-n junction operationally equivalent to those produced by their crystalline counterparts. Amorphous silicon or germanium (Group IV) films were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for p-n junctions for solar cell applications.

Amorphous silicon alloys have now been prepared with significantly reduced concentrations of localized states in the energy gaps thereof and of high electronic quality. However, some defects still exist in the semiconductor films which lowers the efficiency of the photoresponsive device. Similarly, crystalline semiconductor materials suffer from defects in the crystalline lattice. Certain areas of the lattice may have a high density of localized states which would decrease the efficiency of any photoresponsive device, particularly solar cells.

Defects in portions of a semiconductor device may also cause electrical shorting, thereby rendering at least portions of the semiconductor body electrically inoperative. Depending upon the location of the defective portion of the semiconductor body and the severity of the short, the electrical output of the entire semiconductor body may be significantly decreased. It is therefor advantageous to identify those defective portions of the semiconductor body so that those electrically defective portions can be insulated or isolated from the electrically operative portions thereof. This is particularly valuable for large area amorphous semiconductor bodies where there is a long carrier path and the probability of defective portions increases. When only electrically operative portions of the semiconductor device are electrically connected, the total electrical output of the semiconductor device is maximized and overall efficiency increases.

The many objects and advantages of the present invention will become clear from the drawings, the detailed description of the invention and the claims which follow.

BRIEF SUMMARY OF THE INVENTION

Disclosed herein is a method of electrically isolating portions of the semiconductor body of a semiconductor device having a common, electrically-conductive substrate. The major utility for electrically isolating portions of a semiconductor body, as described in the present invention, are (1) to improve the efficiency of photovoltaic devices, such as solar cells; (2) to improve the efficiency of semiconductor devices; and (3) to produce small surface area photovoltaic devices from larger surface area photovoltaic devices.

As to the method of fabricating improved solar cells, the solar cells are of the general type having a common, electrically-conductive substrate layer, an amorphous semiconductor body deposited upon the substrate layer and a transparent, electrically conductive layer deposited atop the amorphous body. The method includes the steps of dividing the semiconductor body of the solar cell into a plurality of parallel rows of electrically-isolated portions formed by discrete transparent conductive oxide segments, testing the electrical output of each isolated portion of the semiconductor body, connecting each isolated portion of the semiconductor body providing satisfactory electrical output to an electrically conductive strip which provides an electrical contact from the semiconductor body, providing the substrate with an electrical contact, and encapsulating the solar cell between an upper, electrically-insulating, light-admitting, protective layer and a lower, electrically-insulating layer.

An improved panel of solar cells is formed by physically and electrically forming a plurality of solar cells fabricated by the foregoing process onto a sheet-like member. The improved solar cell produced by the foregoing method includes a plurality of substantially electrically isolated portions into which the semiconductor body of the solar cell is divided, at least one electrically conductive strip, each isolated portion of the semiconductor body providing satisfactory electrical output being electrically connected to the at least one conductive strip, the conductive strip providing an electrical contact associated with the semiconductor body, an electrical contact associated with the substrate layer, and an upper, electrically-insulating, light-admitting, protective layer and a lower electrically-insulating layer for encapsulating the solar cells therebetween so that only portions of the semiconductor body providing satisfactory electrical output are electrically connected thereby improving the overall efficiency of the solar cell.

As to the second use of the method of electrically isolating portions of a semiconductor body wherein the efficiency of photovoltaic devices are improved, the photovoltaic devices are of the type which include an electrically conductive substrate layer and a semiconductor body deposited upon the substrate layer. The method includes the steps of dividing the semiconductor body into a plurality of portions, each portion being substantially electrically isolated from other portions; testing the electrical output of each isolated portion of the semiconductor body to identify those portions of the semiconductor body which provide unsatisfactory electrical output; attempting to improve the electrical output of any isolated portion of the semiconductor body not providing satisfactory electrical output; and connecting only those isolated portions of the semiconductor body initially providing satisfactory electrical output and providing satisfactory electrical output following the attempted improvement thereof, thereby improving the overall efficiency of the photovoltaic device.

And finally with respect to the third use of the method of isolating portions of a semiconductor body wherein small surface area photovoltaic devices are fabricated from larger surface area photovoltaic devices, the larger area photovoltaic device is of the type which includes a common electrically conductive substrate layer, a semiconductor body deposited upon the substrate layer and a transparent, electrically conductive layer deposited atop the semiconductor body. The method includes the steps of dividing the large area semiconductor body into a plurality of electrically isolated portions by dividing the transparent layer into a plurality of discrete segments corresponding to the plurality of isolated portions into which the large area semiconductor body is divided; and severing the large area semiconductor device between isolated portions to form at least one discrete small area semiconductor device which includes a segment of the common substrate, a corresponding segment of the large area semiconductor body, and a corresponding discrete segment of the transparent layer.

DETAILED DESCRIPTION OF THE DRAWINGS

I. The Tandem Photovoltaic Cell

Figure 1:
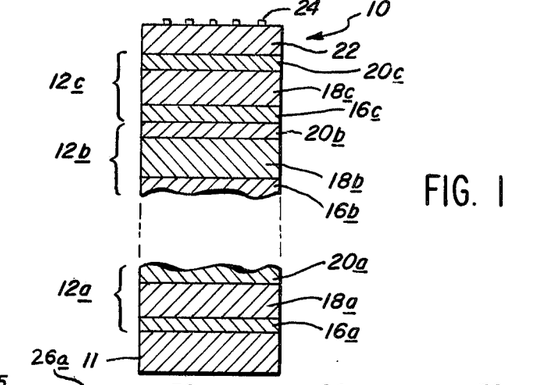
FIG. 1 is a fragmentary, cross-sectional view of a cascade photovoltaic cell comprising a plurality of p-i-n-type cells, each layer of the cells including an amorphous, semiconductor alloy.

Referring now to the drawings and particularly to FIG. 1, a stacked, tandem, or cascade-type, photovoltaic cell, formed of succesive p-i-n layers each including an amorphous semiconductor alloy, is shown generally by the reference numeral 10. One of the methods described in the present invention, is, in the preferred embodiment, adapted to produce an improved photovoltaic cell of this type. However, that method and other methods, also described herein, are not limited solely to the production of stacked p-i-n photovoltaic cells, but are of equal value in the production of improved Schottky or improved MIS (metal-insulator-semiconductor) type cells or simply the production of improved semiconductor devices. Regardless of cell type, the novel production methods described herein have their greatest utility in connection with photovoltaic cells formed with uniform layers of semiconductor materials and with a uniform transparent conductive oxide layer deposited onto the semiconductor layers.

More particularly, FIG. 1 shows a plurality of p-i-n solar cells 12a, 12b, and 12c. Below the lowermost cell 12a is a substrate 11 which may be transparent or formed with a metallic surface foil. Although certain applications may require a thin oxide layer and/or a series of base contacts prior to the application of the amorphous material, for the purpose of this application the term substrate shall include not only a flexible film but also any elements added thereto by preliminary processing. Most commonly, the substrate 11 may be formed of stainless steel, aluminum, tantalum, molybdenum, or chrome.

Each of the cells 12a, 12b, and 12c includes an amorphous alloy body containing at least a silicon alloy. Each of the alloy bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although stacked p-i-n cells are illustrated, this invention is equally adapted for single or stacked n-i-p cells.

For each of the cells 12a, 12b and 12c, the p-type layers are characterized by low light absorption, high conductivity alloy layers. The intrinsic alloy layers are characterized by an adjusted wavelength threshold for a solar photoresponse, high light absorption, low dark conductivity and high photoconductivity including sufficient amounts of a band gap adjusting element or elements to optimize the band gap for the particular cell application. Preferably, the intrinsic layers are band gap adjusted to provide cell 12a with a lowest band gap, cell 12c with the highest band gap, and cell 12b with a band gap between the other two. The n-type layers are characterized by low light absorption, high conductivity alloy layers. The thickness of the n-type layers is preferably in the range of about 25 to 500 angstroms. The thickness of the band gap adjusted, amorphous intrinsic alloy layers is preferably between about 2000 angstroms to 30,000 angstroms. The thickness of the p-type layers is preferably between 50 to 500 angstroms. Due to the shorter diffusion length of the holes, the p-type layers generally will be as thin as possible. Further, the outermost layer, here the p-type layer 20c, will be as thin as possible to avoid absorption of light and need not include the band gap adjusting element or elements.

It is to be understood that following the deposition of the semiconductor alloy layers a further deposition step is performed. In this step, a continuous or discontinuous transparent conductive oxide layer 22 is added atop the n-type layer 20c, with transparent conductive oxide layer may, for example, be a thin, 500 angstrom thick film of indium tin oxide, cadmium stannate, or doped in oxide. Further, an electrically conductive grid pattern 24, described in detail hereinafter, may be added to the top surface of the transparent conductive oxide layer 22 with an electrically conductive paste. According to the principles of the present invention, a discontinuous transparent, conductive oxide layer 22, see FIG. 2b, is formed on the semiconductor body. An electrode grid 24 may be added when the stacked cell is of sufficiently large surface area, or where the conductivity of the transparent conductive oxide layer 22 is insufficient, so as to shorten the carrier path and increase the conductive efficiency of the cell. Since, in the present invention, each solar cell 10 is preferably about a one foot square, generally planar member, the discontinuous transparent conductive oxide layer is necessary.

II. Method Of Electrically Isolating Portions Of The Semiconductor Body

Figure 2A:
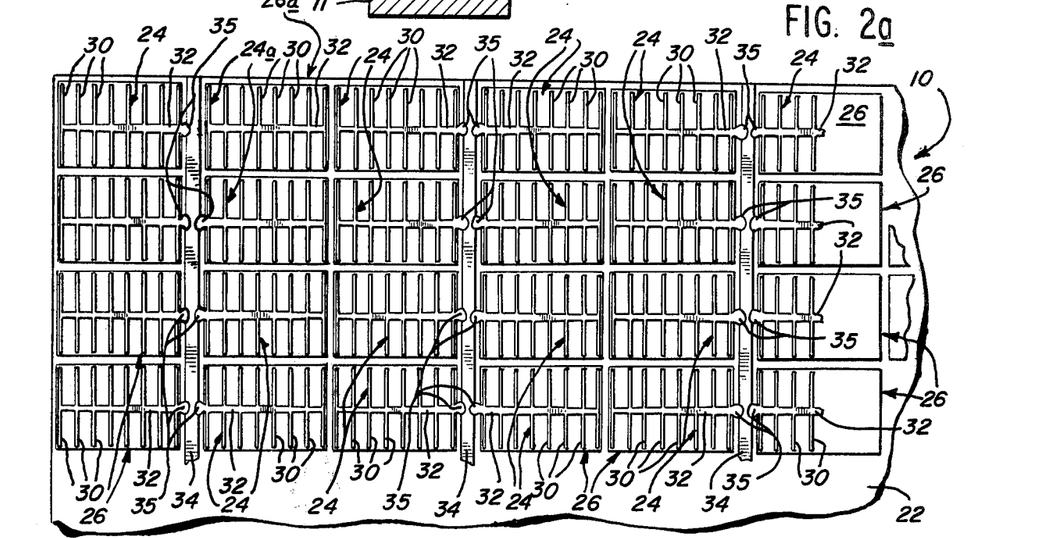
FIG. 2a is a fragmentary top plan view of one embodiment of the present invention illustrating the electrical grid pattern formed on the transparent conductive oxide layer to divide the semiconductor body into a plurality of isolated portions.
Figure 2B:
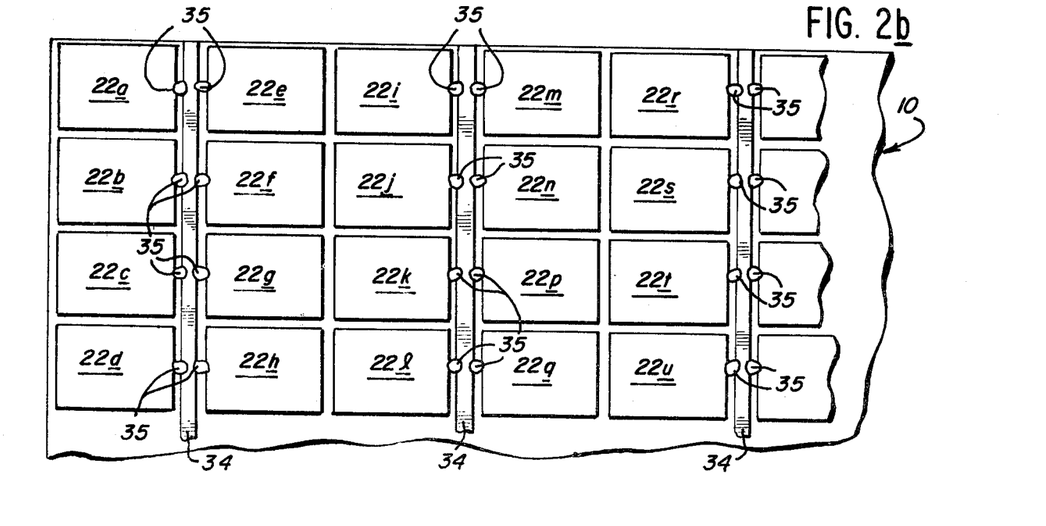
FIG. 2b is a fragmentary top plan view illustrating a further embodiment of the present invention wherein discrete segments of the transparent conductive oxide layer divide the semiconductor body into a plurality of isolated portions.

FIG. 2a depicts a partial section of the upper surface of the transparent conductive oxide layer 22 of a single solar cell 10. As can be readily determined from that figure, the semiconductor body of the single solar cell 10 is divided into a plurality of electrically isolated portions 26 in a manner which will be described hereinafter. Although the exact number and arrangement of the isolated portions 26 of the semiconductor body may vary without departing from the spirit or scope of the present invention, in the preferred embodiment, twelve (12) parallel rows of fifteen (15) isolated portions 26 (a total of one hundred-eighty subcells) are formed from each solar cell 10. The term "isolated portion" is defined herein as a portion of a semiconductor device, such as a solar cell, which is electrically isolated from other portions of the semiconductor device, but which shares a common substrate or electrode with those other portions.

The isolated portions 26 are formed, in the preferred embodiment, by a discrete segment of the transparent conductive oxide layer 22 deposited atop the semiconductor body of the photovoltaic cell 10. Each isolated portion 26 may be formed from the continuous transparent conductive oxide layer 22 by any well known photolithographing and chemical etching method. For instance, a photoresist solution may be applied to the surface of the transparent conductive oxide layer 22 and pre-heated to dry off solvents, thus leaving a thin film as a residue. The grid pattern 24, the particular form of which will be described hereinafter, is then laid over the film, and those portions of the film not covered by the pattern are exposed to electro-magnetic radiation, typically in the ultraviolet region of the spectrum, or to a beam of electrons of appropriate energy to develop the film. During the development of the film, using conventional chemical or plasma procedures, the exposed portions (positive resist) or the unexposed portions (negative resist) of the film and the underlying transparent conductive oxide layer 22 are removed. The residual photoresist film is washed with a solvent to remove same from the surface of the transparent conductive oxide layer 22. A grid pattern 24 may now be applied onto the surface of the now isolated portions of the transparent conductive oxide layer 22.

During the course of the foregoing processing, the drying or curing process includes so-called "pre-bake" and "post-bake" steps which may be implemented by heating the photoresist solution to about 95 degrees to 120 degrees C. for about 20-25 minutes. As an alternative, microwave curing, or any other well known curing technique may be employed. Such alternate techniques are used either (1) to reduce the length of dry time or (2) maintain the lower layers of the triad of amorphous layers of the solar cell near ambient temperature. These various curing techniques are all within the scope of this invention.

In the embodiment illustrated in FIG. 2b, the isolated portions 26 of the semiconductor body can be formed by dividing the transparent conductive oxide layer 22 into a plurality of discrete segments 22a–22u without applying a grid pattern 24 thereonto. It is to be understood that for purposes of this invention the numeral 26 will refer to isolated portions of the transparent conductive oxide layer 22 with a grid pattern applied thereonto, while the numerals 22a–22u refer to isolated portions of the transparent conductive oxide layer 22 not having the grid pattern applied thereonto. The discrete segments 22a–22u of the transparent conductive oxide layer 22 may be formed either by originally depositing the transparent conductive oxide layer 22 in a discontinuous fashion to form a plurality of spaced, discrete segments 22a–22u, or by depositing a continuous transparent conductive oxide layer and then removing intermediate parts by the photolithography and etching technique described previously.

As described hereinabove, each isolated portion 26, whether formed by a continuous or discontinuous transparent conductive oxide layer may have a grid pattern 24 applied thereonto. The width dimension of each grid pattern 24 is defined by a plurality of substantially equally spaced, relatively thin, parallel, electrically-conductive rays or fingers 30 radiating perpendicularly from both sides of a tapered, relatively thick, electrically-conductive, busbar-connecting ray 32 which defines the length dimension of the grid pattern 24. The total width of each isolated portion 26 is about three-quarters (¾) of an inch and the total length of each subcell 26 is about one (1) inch. The grid patterns 24 are formed so as to maximize the current collected from the semiconductor body while minimizing the amount of light prevented from entering the semiconductor body. In the preferred embodiment, a one square foot solar cell 10 is divided into twelve (12) parallel rows of fifteen (15) isolated portions 26, or a total of one hundred-eighty (180) isolated portions 26. It is preferred that each grid pattern 24 include eight (8) parallel rays 30 and that the busbar-connecting ray 32 increase in thickness to a maximum dimension of approximately one-sixteenth (1/16) of an inch at the end thereof remote from the busbar 34. It should be readily apparent to one ordinarily skilled in the art that the arrangement of isolated portions 26, the length and width dimensions of the grid patterns 24 and the isolated portions 26, the number of parallel rays 30, the number of parallel rows of the isolated portions 26, the total number of isolated portions 26 formed on any given solar cell 10 and hence the size and configuration of the solar cell 10, or other photovoltaic device may vary without departing from the spirit and scope of the present invention. Whatever arrangement is selected, the grid patterns 24 may be printed by any well known technique, such as screen printing, onto the transparent conductive oxide segments with an electrically conductive material such as silver paste.

While two methods of forming the isolated portions 26 of the semiconductor body of a photovoltaic cell have been described, other well known methods of "scribing" those isolation portions are within the scope of the present invention. Moreover when used herein, the term "scribing" is intended to encompass all such well known methods of removing the transparent conductive oxide pattern 22, which include, but are not limited to: (a) chemical etching; (b) plasma etching; (c) various laser techniques; (d) a water jet technique; and (e) applying the original transparent conductive oxide layer with a mask to initially form said distinct, discontinuous segments.

III. Using The Electrically Isolated Portions Of A Semiconductor Body

Each isolated portion 26 of a solar cell 10 may now be individually tested to determine whether the electrical output therefrom is sufficient to render it "electrically operative" or "electrically operable". As used within the context of the instant application, the terms "electrically operative isolated portion" or "electrically operable isolated portion" refer to those isolated portions 26 of the semiconductor body of a given solar cell 10 which provide a satisfactory voltage output. It has been determined that the electrical connection of an isolated portion 26 of a semiconductor body providing unsatisfactory electrical output reduces the overall efficiency of the solar cell 10. Further, since the isolated portions 26 of each solar cell 10 are connected in parallel, the electrical connection of any isolated portion 26 of the solar cell 10 providing a very low voltage output could significantly decrease the electrical output of the entire solar cell 10.

After the electrical testing of each individual isolated portion 26 of a given solar cell 10 has been completed, an elongated, copper, electrically-conductive strip or busbar 34 is affixed to the surface of the transparent conductive oxide layer 22 or the semiconductor body with an electrically insulating silicone adhesive. The silicone adhesive may be applied as a very thin layer because the busbars 34 are to be positioned between alternate rows of isolated portions 26 of the semiconductor body. In other words, even after the busbars 34 are affixed to semiconductor device, a gap remains between adjacent the discrete segments 22a–22u of the isolated transparent conductive oxide portions 26 and the associated busbar 34. In the preferred embodiment, wherein twelve rows of isolated portions 26 are provided, six conductive strips of busbars 34, about ⅛ of an inch wide and 0.003 of an inch thick, are employed. The busbar-connecting ray 32 from each electrically operative isolated portion 26 of a semiconductor body is electrically connected to an adjacent busbar 34 using a dot of electrically conductive material such as silver paste 35. The isolated portions 26 whose electrical output falls below the selected minimum satisfactory level remain electrically isolated by the insulating silicone adhesive from the electrically conductive copper busbar 34. In FIG. 2a, it an be seen that, because of unsatisfactory electrical output, the isolated portion 26a with the grid pattern 24a thereon has not been electrically connected by a dot of silver paste 35 to the busbar 34.

Figure 3:
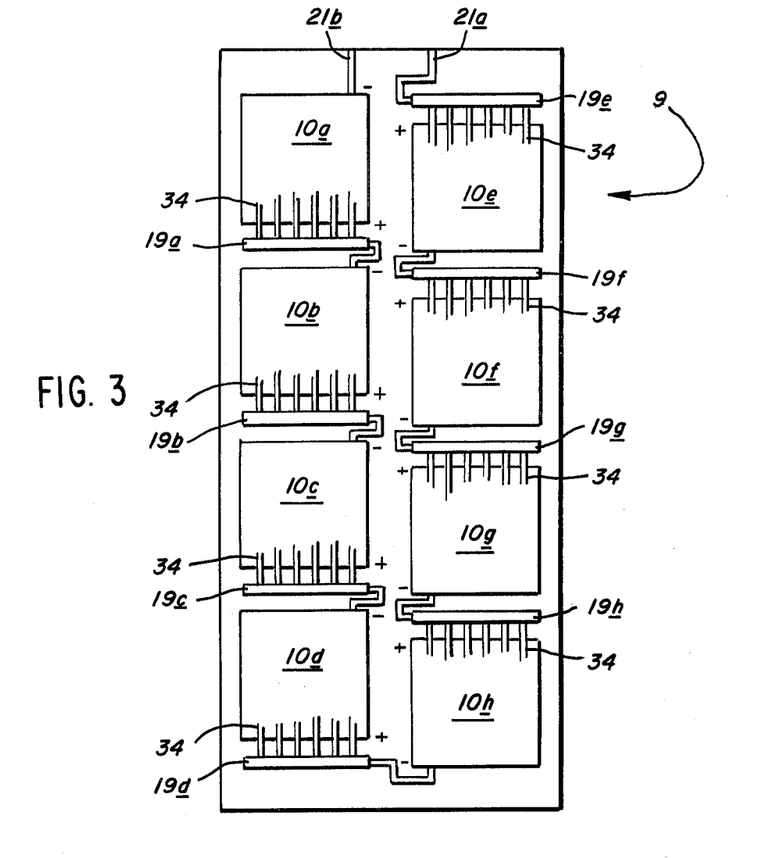
FIG. 3 is a top plan view illustrating the preferred arrangement of electrical-connection between a plurality of solar cells to form the improved solar cell panel of the present invention.

As can be seen from the preferred embodiment illustrated in FIG. 3, the ends of the six copper busbars 34 extend beyond the periphery of each solar cell 10. Although not illustrated, the bottom or back surface of each solar cell 10 will also be provided with an electrode or electrical contact, such as by spot welding. By connecting the six busbars 34 and the substrate contact, the electrical output of the entire solar cell 10 can be electrically tested. Those solar cells 10 providing satisfactory electrical output values are now ready to be encapsulated between protective, electrically insulating sheeting layers, as will be described fully hereinafter.

IV. The Dual-Chamber Vacuum Assembly

Specially designed apparatus is required to encapsulate the solar cells 10 between insulated, protective sheeting. While one preferred embodiment of the apparatus for accomplishing the encapsulating function is illustrated in FIG. 4, it is to be understood that such function may be accomplished with other apparatus, all forms of which are within the scope of the present invention.

Figure 4:
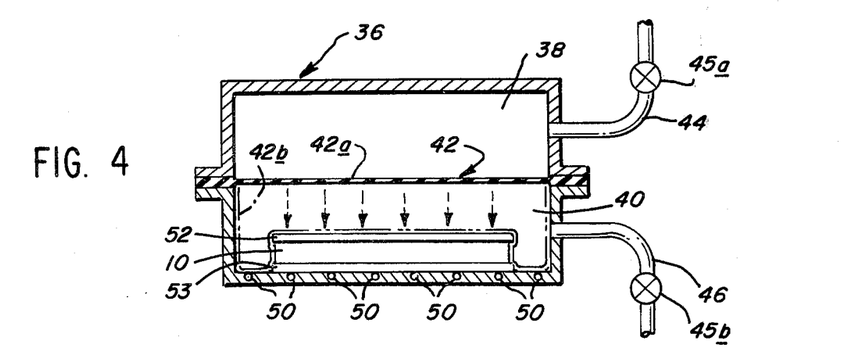
FIG. 4 is a cross-sectional representation of the dual vacuum assembly in which the bonding agent flows and cures to bind the encapsulating layers to the opposite surfaces of a solar cell of the present invention.

More particularly, in FIG. 4 a dual-chamber vacuum assembly is illustrated generally by the reference numeral 36. The vacuum assembly 36 includes an upper chamber 38, a lower chamber 40 and a very flexible silicone rubber diaphragm 42 which is adapted to (1) form a vacuum seal between the upper and lower chambers of the vacuum assembly 36, and (2) conform to the contour of a photovoltaic device for purposes of transmitting a force to the device. Although not shown, it should be understood that access into the lower chamber 40 is necessary for purposes of introducing said affixing the unencapsulated solar cell 10 or other photovoltaic device therein to bond the solar cell 10 or other photovoltaic device between an upper transparent layer 52 and a lower electrically insulated layer 53. An air port 44, with a check valve 45a, forms a passageway into the interior of the upper chamber 38 and an air port 46, with a check valve 45b forms a passageway into the interior of the lower chamber 40 for the simultaneous evacuation of air from both chambers and for the subsequent reintroduction of air into the upper chamber 38. A plurality of heating elements 50, provided in the base of the lower chamber 40, are adapted to warm the vacuum assembly 36 to the proper flow and curing temperatures for the bonding agent.

In operation, a layer of a bonding agent, such as ethyl vinyl acetate, is spread or sprayed over at least substantial portions of both the transparent conductive oxide layer 22 and the substrate layer 11 of the solar cell 10. Encapsulating layers 52, 53 such as (1) glass or (2) a plastic synthetic resin such as TEDLAR (registered trademark of Dupont) of slightly greater length and width dimensions than the length and width dimensions of the solar cell 10 or other photovoltaic device are placed over the ethyl vinyl acetate. The function of the ethyl vinyl acetate is to bond the encapsulating layers 52, 53 to the solar cell 10 or other photovoltaic device. The function of the upper or exposed encapsulating layer 52 is to admit light, provide electrical insulation, and protect the solar cell 10 or other photovoltaic device from environmental conditions when the solar cell 10 or solar cell panel 9 is operatively mounted, for instance, on a roof-top. The function of the lower encapsulating layer 53 is to electrically insulate the substrate layer 11 of the solar cell 10 from electrically conductive elements which it may contact when operatively mounted.

In order to cause the bonding agent to flow and cure, the encapsulating layer-ethyl vinyl acetate-solar cell-ethyl vinyl acetate-encapsulating layer sandwich is placed within the lower chamber 40 of the vacuum assembly 36 immediately below the silicone rubber diaphragm 42. First, air is simultaneously removed from both the upper chamber 38 and the lower chamber 40, and then air is pumped or bled back into the upper chamber 38, causing the silicone rubber diaphram 42 to collapse. Pumping continues until the diaphragm 42 exerts a pressure of one atmosphere against the encapsulating layer-ethyl vinyl acetate-solar cell-ethyl vinyl acetate-encapsulating layer sandwich. As air is pumped into the upper chamber 38, the flexible diaphragm 42 is forced downwardly from its normal equilibrium position, shown by the solid line 42a in FIG. 4, to a contour fitting position, shown by the phantom line 42b in FIG. 4, wherein the diaphragm abuts and presses against the solar cell 10 or other photovoltaic device and the interior surface of the lower chamber 40 with a pressure of one atmosphere. The lower chamber 40 of the vacuum assembly 36 is heated to 130 degrees C. by the heating elements 50. At a temperature of 130 degrees C. and at atmospheric pressure, the ethyl vinyl acetate flows and cures, thereby bonding the upper and lower encapsulating layers to the photovoltaic device. Since the ethyl vinyl acetate is spread in a vacuum, no bubbles are formed therein as the flow and curing process proceeds. Fabrication of the photovoltaic device is now complete and the devices may be either used individually or in combination, as desired.

V. The Solar Cell Panel

The solar cell panel, indicated generally by the reference numeral 9 is illustrated in FIG. 3. In this preferred form, eight solar cells 10a–10h are arranged in a four by two matrix to provide the approximately four foot long by two foot wide solar cell panel 9. In the illustrated embodiment, the busbars 34 of each individual solar cell 10a–10h are interconnected such as by electrically conductive ribbons 19a–19h to provide a single contact to transparent layer 22. The ribbon 19a from solar cell 10a is connected to the substrate contact of solar cell 10b; the ribbon 19b, from solar cell 10b is connected to the substrate contact of solar cell 10c; the ribbon 19c from solar cell 10c is connected to the substrate contact of solar cell 10d; the ribbon 19d from solar cell 10d is connected to the substrate contact of solar cell 10h; the ribbon 19h from solar cell 10h is connected to the substrate contact of solar cell 10g; the ribbon 19g from solar cell 10g is connected to the substrate contact of solar cell 10f; the ribbon 19f from solar cell 10f is connected to the substrate contact of solar cell 10e; the ribbon 19e from solar cell 10e and the substrate contact from solar cell 10a provide contacts 21a and 21b, respectively, with which an adjacent solar cell panel 9 may be connected. In this manner, the entire surface area of, for example, a roof top may be covered by interconnecting a plurality of solar cell panels 9.

VI. Other Uses

The division of a large surface area semiconductor body into a plurality of smaller surface area, electrically-insulated portions has other significant utilities. For instance, now that the mass production of continuous webs of photovoltaic devices is about to commence, devices having a surface area of as much as thousand (1000) feet in length by sixteen (16) inches in width will be produced. In order to use the devices as, for instance, the solar cells discussed in this application, it is necessary to cut the continuous web into one square foot cells. And even where the photovoltaic devices are produced as discrete plates, such plates must be cut into smaller plates for use as power supplies for calculators, watches, etc.

It has been found that attempts to cut or sever the large surface area photovoltaic devices into devices of smaller surface area produce short circuits rendering the devices inoperative. However, if the large surface area semiconductor devices are first divided into a plurality of smaller surface area devices by dividing the semiconductor body thereof into the plurality of electrically-isolated portions, as described herein, the large surface area semiconductor device can then be severed along the spaces or gaps between individual, isolated portions to form the appropriately sized, small surface area semiconductor devices without electrically shorting said devices.

It has also been determined that the isolated portions 26 of the semiconductor body which do not provide sufficient electrical output may sometimes be cured, such as by a laser scan. After the defect is removed, the now acceptable isolated portions and the originally acceptable isolated portions may both be electrically connected. The overall efficiency of the semiconductor device is thereby improved.

It should be understood that the present invention is not limited to the precise structure of the illustrated embodiments. It is intended that the foregoing description of the presently preferred embodiments be regarded as an illustration rather than as a limitation of the present invention. It is the following claims, including all equivalents, which are intended to define the scope of this invention.

I claim:

1. A method of fabricating improved photovoltaic devices, each photovoltaic device including: (a) a common electrically conductive substrate layer; (b) a semiconductor body deposited upon the substrate layer; and (c) a transparent, electrically conductive layer deposited atop the semiconductor body; the method including the steps of:

dividing the semiconductor body into a plurality of portions, each portion being substantially electrically isolated from other portions;

testing the electrial output of each isolated portion of the semiconductor body;

connecting only those electrically operative isolated portions to an electrically conductive strip; the conductive strip providing an electrical contact associated with the semiconductor body; and providing an electrical contact on the substrate layer; whereby the overall efficiency of the photovoltaic device is improved by electrically connecting only those electrically operative portions of the semiconductor body.

2. A method of fabricating an improved panel of photovoltaic devices, each of said photovoltaic devices including: (a) a common electrically conductive substrate layer; (b) a semiconductor body deposited upon the substrate layer; and (c) a transparent, electrically-conductive layer deposited atop the semiconductor body; the method including the steps of:

dividing the semiconductor body of each photovoltaic device into a plurality of portions, each portion being substantially electrically isolated from other portions of each semiconductor body;

testing the electrical output of each isolated portion of each semiconductor body for operativeness;

connecting only those electrically operative isolated portions of each semiconductor body to a conductive strip associated with that semiconductor body, the conductive strip providing a contact from the transparent layer of each photovoltaic device;

providing an electrical contact on the substrate layer of each photovoltaic device;

structurally and electrically joining a plurality of photovoltaic devices to form a panel of photovoltaic devices in which the transparent layer contact of each of the plurality of photovoltaic devices and the substrate layer contact of each of the plurality of photovoltaic devices are electrically connected; whereby the overall efficiency of the photovoltaic device panel is improved by electrically connecting only those electrically operative portions of each semiconductor body.

3. A method in claims 1 or 2, wherein the transparent, electrically conductive layer is originally continuous and the step of dividing the semiconductor body into a plurality of isolated portions comprises scribing the transparent layer into a plurality of discrete segments.

4. A method as in claim 3, wherein a grid pattern is applied on each discrete transparent layer segment.

5. A method as in claims 1 or 2, wherein the transparent electrically conductive layer is applied as an originally discontinuous layer to form a plurality of electrically isolated discrete, transparent layer segments.

6. A method as in claim 5, wherein a grid pattern is applied onto each discrete transparent layer segment.

7. A method as in claims 1 or 2, including the further step of encapsulating each photovoltaic device between an upper, electrically-insulating, light-admitting, protective layer and a lower electrically-insulating layer.

8. A method as in claim 7, including the further step of forming the photovoltaic device as a large, generally planar member divided into a plurality of generally parallel rows, each row defined by the plurality of the isolated portions.

9. A method as in claim 8, wherein the conductive strip is a copper busbar secured between alternate rows of the isolated portions of the body by means of an electrically insulating silicone adhesive.

10. A method of improving the electrical output of semiconductor devices, the devices including: (a) an electrically conductive substrate layer; (b) a semiconductor body deposited upon the substrate layer; and (c) a transparent, electrically conductive layer deposited atop the semiconductor body; the method including the steps of:

dividing the semiconductor body into a plurality of portions, each portion being substantially electrically isolated from other portions;

testing the electrical output of each isolated portion of the semiconductor body to identify electrically inoperative isolated portions of the semicondcutor body;

subjecting at least those electrically inoperative isolated portions of the semiconductor body to a defect curing procedure adapted to improve the electrical output thereof; and electrically interconnecting only those initially electrically operative isolated portions of the semiconductor body and those isolated portions of the semiconductor body which have become electrically operative following the curing procedure, thereby improving the overall efficiency of the semiconductor device.

11. A method as in claim 10, including the further step of retesting the electrical output of those isolated portions of the semiconductor body following the curing procedure to determine the success of said curing procedure.

12. A method as in claim 10, including the further step of applying a grid pattern onto each isolated portion of the semiconductor body.

13. A method as in claim 10, including the further step of encapsulating each semiconductor device between an upper, electrically-insulating, light-admitting, protective layer and a lower electrically-insulating layer.

14. An improved solar cell including: (a) a common electrically conductive substrate layer; (b) a semiconductor body deposited upon the substrate layer; and (c) a transparent electrically conductive layer deposited atop the semiconductor body; the solar cell comprising, in combination:

a plurality of substantially electrically isolated small area portions into which the semiconductor body is divided, at least one small area portion being electrically inoperative;

at least one electrically conductive strip;

only electrically operative portions of the semiconductor body electrically connected to the at least one conductive strip, the at least one conductive strip providing an electrical contact associated with the semiconductor body;

an electrical contact on the substrate layer; and an upper, electrically-insulating, light-admitting, protective layer and a lower electrically-insulating layer, the solar cells encapsulated between the upper and lower layers, so that only electrically operative portions of the semiconductor body are electrically connected, thereby improving the overall efficiency of the solar cell.

15. A solar cell as in claim 14, wherein the semiconductor body includes at least one triad of layers, said at least one triad of layers comprising a p-conductivity layer, an intrinsic layer and an n-conductivity layer.

16. A solar cell as in claim 14, further including a grid pattern formed onto each isolated portion of the semiconductor body.

17. A solar cell as in claim 16, wherein the solar cell is an approximately one foot square, generally planar member divided into a plurality of generally parallel rows of isolated portions of the semiconductor body.

18. A solar cell as in claim 17, wherein each of the at least one conductive strip is a copper busbar secured between alternate rows of the isolated portions of the semiconductor body.

19. A solar cell as in claim 18, wherein the copper busbars are secured to isolated portions of the semiconductor body with an electrically insulating silicone adhesive.

20. A method of fabricating a smaller surface area semiconductor device from a semiconductor device having a larger surface area; the larger area semiconductor device including: (a) a common, electrically conductive substrate layer; and (b) a semiconductor body deposited upon the substrate layer; the method including the steps of:
   providing a plurality of discrete segments of a transparent, electrically conductive layer atop the semiconductor body so as to divide the semiconductor body into a plurality of electrically isolated portions; and
   then severing the large area semiconductor device between discrete segments of the transparent layer to form at least one discrete small area semiconductor device which includes (a) a segment of the common substrate, (b) a corresponding portion of the large area semiconductor body, and (c) a corresponding discrete segment of the transparent layer.

21. A method as in claim 20, wherein, prior to severing the large area semiconductor device, the electrical output of each isolated portion of the semiconductor body is tested and only those electrically operative isolated portions are severed.

22. A method as in claim 20, including the further step of applying a grid pattern onto each isolated portion of the transparent layer.

23. A method as in claim 20, wherein the step of providing a plurality of discrete segments of a transparent electrically conductive layer includes the further step of:
   depositing a continuous transparent, electrically conductive layer; and
   scribing the transparent, electrically conductive layer to form a plurality of discrete segments.

24. A method as in claim 20, wherein the step of providing a plurality of discrete segments of a transparent, electrically conductive layer includes the further step of:
   depositing an originally discontinuous transparent, electrically conductive layer to form a plurality of discrete segments.

* * * * *

UNITED STATES PATENT AND TRADEMARK OFFICE
CERTIFICATE OF CORRECTION

PATENT NO. : 4,419,530

DATED : December 6, 1983

INVENTOR(S) : Prem Nath

It is certified that error appears in the above-identified patent and that said Letters Patent are hereby corrected as shown below:

```
Col.  1, line 60, delete "junction" and insert
                  --junctions--;
Col.  4, line 48, delete "with" and insert --from--;
Col.  5, line 29, delete "with" and insert --which--;
Col.  5, line 31, delete "in" and insert --tin--;
Col.  8, line 5,  delete "the" first occurrence;
Col.  8, line 9,  delete "of" first occurrence and insert --or--;
Col.  8, line 19, delete "an" and insert --can--;
Col.  8, line 56, delete "said" and insert --and--;
Col. 13, line 16, delete "smaller" and insert
                  --small--.
```

Signed and Sealed this

Eighth Day of January 1985

[SEAL]

Attest:

*Attesting Officer*

GERALD J. MOSSINGHOFF

*Commissioner of Patents and Trademarks*